United States Patent
Price

(10) Patent No.: US 9,721,769 B2
(45) Date of Patent: Aug. 1, 2017

(54) IN-VACUUM ROTATIONAL DEVICE

(71) Applicant: Gencoa Ltd., Merseyside (GB)

(72) Inventor: Jonathan Price, Merseyside (GB)

(73) Assignee: GENCOA LTD., Liverpool (Merseyside) (GB)

( * ) Notice: Subject to any disclaimer, the term of this patent is extended or adjusted under 35 U.S.C. 154(b) by 273 days.

(21) Appl. No.: 14/372,003

(22) PCT Filed: Jan. 14, 2013

(86) PCT No.: PCT/GB2013/050064
§ 371 (c)(1),
(2) Date: Jul. 11, 2014

(87) PCT Pub. No.: WO2013/104925
PCT Pub. Date: Jul. 18, 2013

(65) Prior Publication Data
US 2015/0008120 A1   Jan. 8, 2015

(30) Foreign Application Priority Data

Jan. 13, 2012   (GB) .................................. 1200574.0

(51) Int. Cl.
*C23C 14/34* (2006.01)
*H01J 37/34* (2006.01)

(52) U.S. Cl.
CPC ...... *H01J 37/3405* (2013.01); *C23C 14/3407* (2013.01); *H01J 37/342* (2013.01); *H01J 37/3435* (2013.01)

(58) Field of Classification Search
CPC . C23C 14/3407; H01J 37/3405; H01J 37/342; H01J 37/3435
(Continued)

(56) References Cited

U.S. PATENT DOCUMENTS

| 4,445,997 A * | 5/1984 | McKelvey | H01J 37/3405 |
| | | | 204/192.12 |
| 6,365,010 B1 * | 4/2002 | Hollars | C23C 14/35 |
| | | | 204/192.12 |

(Continued)

FOREIGN PATENT DOCUMENTS

EP    1584707 A1    10/2005
EP    1655762 A1    5/2006
(Continued)

OTHER PUBLICATIONS

International Search Report mailed Aug. 21, 2013, in PCT/GB2013/050064.

*Primary Examiner* — Rodney McDonald
(74) *Attorney, Agent, or Firm* — Daniel A. Tanner, III; TannerIP PLLC

(57) ABSTRACT

This invention relates to the in-vacuum rotational device on a cylindrical magnetron sputtering source where the target or target elements of the target construction of such device are enabled to rotate without the need of a vacuum to atmosphere or vacuum to coolant dynamic seal. This invention relates to the use of the device in vacuum plasma technology where a plasma discharge, or any other appropriate source of energy such as arcs, laser, which can be applied to the target or in its vicinity would produce suitable coating deposition or plasma treatment on components of different nature. This invention also relates but not exclusively to the use of the device in sputtering, magnetron sputtering, arc, plasma polymerization, laser ablation and plasma etching. This invention also relates to the use of such devices and control during non-reactive and reactive processes, with or without feedback plasma process control. This invention also relates to the arrangement of these devices as a singularity or a plurality of units. This invention also relates to the target construction which can be used in such device. This inven- (Continued)

tion also relates to the use of these devices in different power modes such as DC, DC pulsed, RF, AC, AC dual, HIPIMS, or any other powering mode in order to generate a plasma, such as sputtering plasma, plasma arc, electron beam evaporation, plasma polymerization plasma, plasma treatment or any other plasma generated for the purpose of a process, for example, and not exclusively, as deposition process or surface treatment process, etc.

20 Claims, 8 Drawing Sheets

(58) Field of Classification Search
USPC .................................... 204/298.21, 298.22
See application file for complete search history.

(56) References Cited

U.S. PATENT DOCUMENTS

| | | | |
|---|---|---|---|
| 2004/0074770 A1* | 4/2004 | Wityak | B65G 3/00 204/298.14 |
| 2006/0096855 A1 | 5/2006 | Newcomb et al. | |
| 2008/0012460 A1 | 1/2008 | Bernick et al. | |
| 2010/0012487 A1* | 1/2010 | Heinrich | H01J 37/3402 204/298.2 |
| 2010/0155226 A1* | 6/2010 | Madocks | H01J 37/3405 204/192.12 |

FOREIGN PATENT DOCUMENTS

| | | |
|---|---|---|
| WO | 00/28104 A1 | 5/2000 |
| WO | 2006/023257 A1 | 3/2006 |
| WO | 2008/154397 A1 | 12/2008 |
| WO | 2011/123646 A2 | 10/2011 |

\* cited by examiner

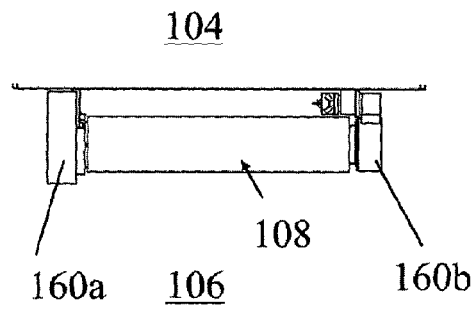
Figure 10
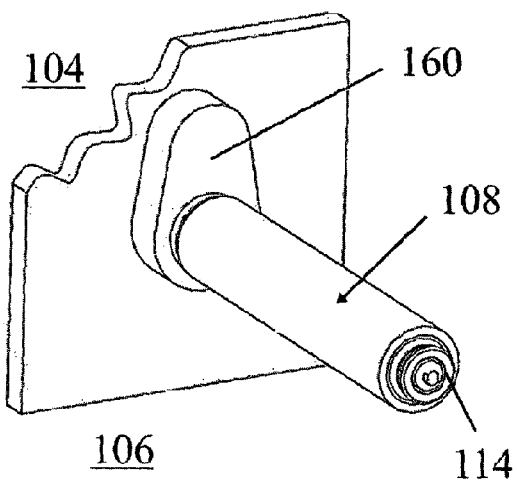
Figure 11
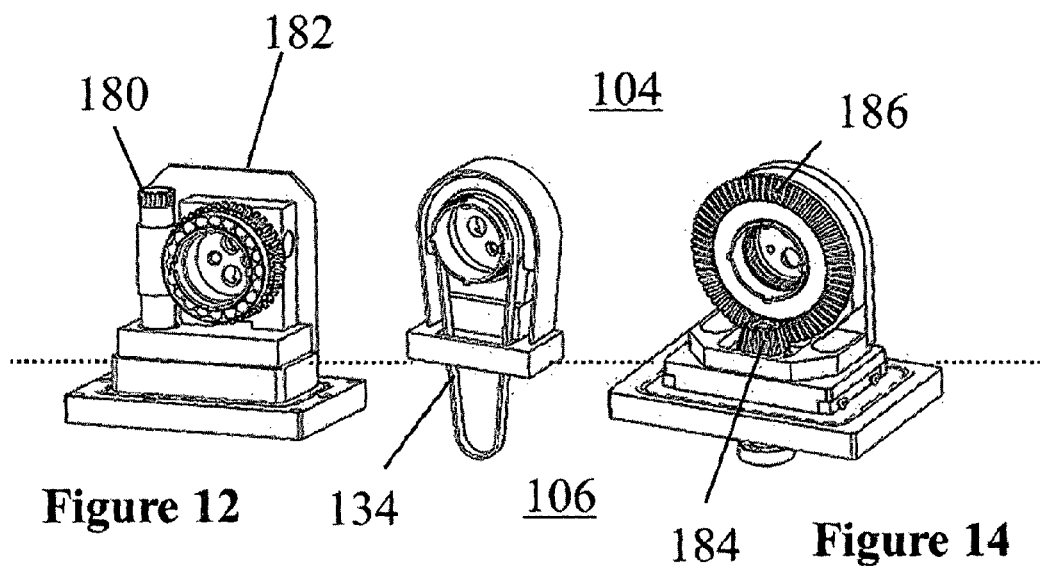
Figure 12    Figure 13    Figure 14

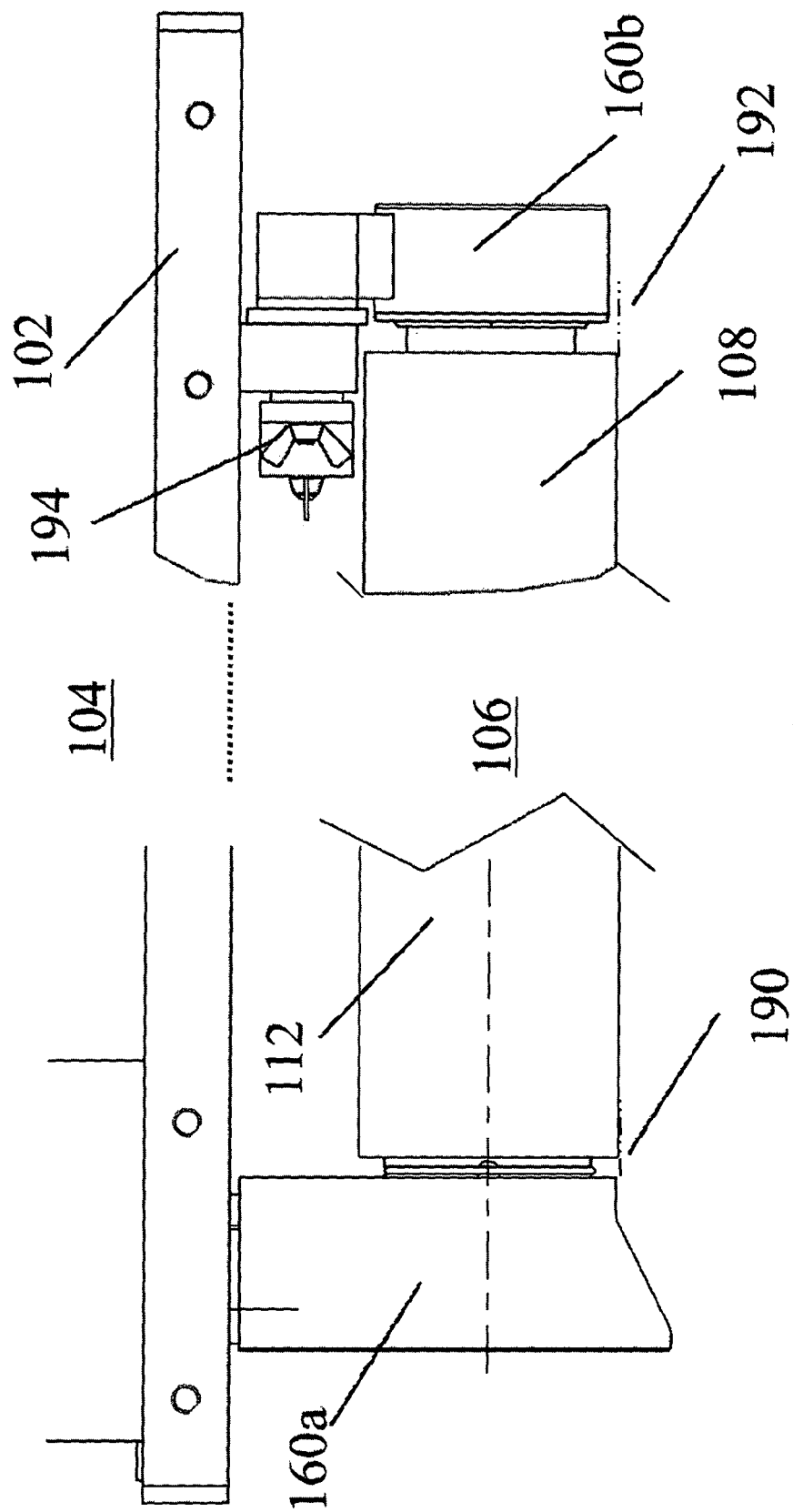

IN-VACUUM ROTATIONAL DEVICE

TECHNICAL FIELD

This invention relates to in-vacuum rotational devices, and in particular, but without limitation to, in-vacuum rotational device suitable for rotating a cylindrical magnetron sputtering source where the target or target elements of the target construction of such device are enabled to rotate. Suitably, the invention eliminates the need for a vacuum to atmosphere or vacuum to coolant dynamic seal.

In many vacuum systems, a moving element needs to be disposed within the vacuum chamber. However, due to system design constraints, it is often desirable, or necessary, to locate an actuator, say a motor, for the moveable element outside the vacuum chamber. There are many reasons why this might be the case, for example, to reduce the vacuum chamber volume, to reduce its pumping requirement, or where the actuator requires frequent maintenance or ready access, which contraindicates its placement within the vacuum chamber itself.

This invention relates, in certain embodiments, but not exclusively, to:

use of the device in vacuum plasma technology where a plasma discharge, or any other appropriate source of energy such as an arc, or a laser, which can be applied to the target or in its vicinity would produce suitable coating deposition or plasma treatment on components of a different nature;

the use of such devices in sputtering, magnetron sputtering, arc, plasma polymerisation, laser ablation, chemical vapour deposition (CVD) and plasma etching;

the use of such devices and control during non-reactive and reactive processes, with or without feedback plasma process control;

the arrangement of these devices as a singularity or a plurality of units;

a target construction which can be used in such device;

the use of these devices in different power modes such as DC, DC pulsed, RF, AC, AC dual, HIPIMS, or any other powering mode in order to generate a plasma, such as sputtering plasma, plasma arc, electron beam evaporation, plasma polymerization plasma, plasma treatment, CVD, or any other plasma generated for the purpose of a process, for example, and not exclusively, as deposition process or surface treatment process, etc.

BACKGROUND ART

Since the advent of rotatable cylindrical magnetron sputtering sources

PTL 0001: U.S. Pat. No. 4,356,073 (SHATTERPROOF GLASS CORPORATION). 1982 Feb. 26.

the use of dynamic seals on a rotating cylindrical target has been a common feature across this sector of the industry. Still today the state of the art involves the use of this type of dynamic seals for the driving (rotation) of the target PTL 0002: US 2007/007129 (BEKAERT ADVANCED COATINGS). 2007 Jan. 11. and PTL 0003: US 2008/0202925 (BEKAERT ADVANCED COATINGS). 2008 Aug. 28.

Existing solutions involving dynamic seals limit several aspects of the operation of such devices, like the air to vacuum, water to vacuum and water to air leak rates. Especially, with regard to leak rates into the vacuum process area, this can have a detrimental effect in the quality of the end product: that product being a plasma process such as coating deposition or plasma treatment. The use of dynamic seals also limits the maximum rotation speed of these targets as higher speeds tend to increase the leak rate into the vacuum media. In addition, lower target rotation speeds tend to increase the level of coating defects during the deposition process. This phenomenon is especially pronounced during so-called "reactive processes" whereby the target material reacts with the gases in the rarefied and/or partial vacuum and/or vacuum atmosphere in order to form a compound of a different nature to the target material itself. In non-reactive processes, a certain level of defects exists in the coating due to the reactivity of the target material with different outgassing elements of the deposition system and/or the target itself. All this can, in turn, create micro-arcing which can be responsible for a lowering in coating quality.

Existing solutions also limit the type of target construction that can be implemented and the ways in which changing the target (a process consumable) can be performed. Firstly, changing a target typically involves the opening of water-to-vacuum static seals which makes them very difficult to handle in very clean environments, such as those found in clean rooms in semiconductor manufacturing environments. Also, the known types of target construction, which use a static water-to-vacuum seal, introduce limitations in the way a target material can be manufactured, typically involving very expensive methods, especially if the purity of the target, its machinability and availability of the target material is complicated.

A need therefore exists for an alternative and/or an improved apparatus and/or method of driving a moveable element in a vacuum system from without the vacuum chamber.

DISCLOSURE OF INVENTION

According to a first aspect of the invention, there is provided an apparatus for rotating a rotatable element located within a vacuum chamber comprising: a hollow support axle extending into the vacuum chamber to define a volume within the vacuum chamber that is sealingly isolated therefrom, the hollow support axle comprising an open end communicating with the exterior of the vacuum chamber, characterised by a target assembly being mounted for rotation about a longitudinal axis of the hollow support axle, and a drive assembly operatively connected to, and configured to rotate, the target assembly.

The term "vacuum chamber" used herein can refer to a process chamber whose pressure can be adjusted, above or below atmospheric pressure, and/or which may contain a partial vacuum, or a process gas species.

A second aspect of the invention provides an essentially cylindrical, but not exclusively, target and backing tube assembly (or target assembly) which are able to rotate by appropriate in-vacuum driving means and which are mounted in a static support carrier tube construction. In the present invention only the target and backing tube assembly rotates via an appropriate engagement to a drive mechanism. In the present invention the main target preferably does not have any dynamic rotating seals as it is in its entirety in the vacuum atmosphere region. The target assembly suitably does not require any static seal. In the present invention the drive mechanism could have a vacuum feed through driving mechanism such as that provided by a ferro-fluidic seal. Alternatively the target and backing tube assembly could be entirely driven by an in-vacuum motor with no need for a dynamic seal in the entirety of the construction. Sealing pertaining to the end block assembly is preferably static except in the case of the drive mechanism input where it could be dynamic or non-existent. In the present invention the electrical and thermal contact between the rotating target assembly and the static carrier tube may be provided by suitable contactors and or contact media. Low friction required for the rotation of the target assembly with respect to the static carrier tube, which may be accomplished by providing suitable load bearing elements and low friction media.

The drive assembly may be located within or without the vacuum chamber.

Suitably, the hollow support axle is configured to rotate with the target assembly detachably affixed thereto. In such a situation, the hollow support axle may extend through a wall of the vacuum chamber separating the evacuated volume thereof from the atmosphere, and is suitably provided with one or more dynamic seals to form a vacuum-tight seal between the support axle and the said wall.

Suitably, the hollow support axle may be static, with the target assembly being mounted for rotation about the support axle's exterior. The drive assembly, in such a situation, is suitably operatively connected to the target assembly.

Suitably, an actuator, such as a motor, is used to actuate the drive assembly, and a ratio changing means, such as a gearbox or pulley mechanism is suitably interposed between the actuator and the support axle or target assembly (as appropriate). The actuator and/or ratio changing means is suitably located outside the vacuum chamber. The transmission means may comprise a main body portion which is sealingly affixed to, and which extends through, a through aperture in a wall of the vacuum chamber. In such a situation, the seal is interposed between the main body portion and the rotatable mounting means. The seal may be of any suitable type for maintaining a seal between two or more relatively rotating components.

The invention suitably provides a mechanism that can remain in situ to which a target assembly is, in use, affixable. By such an arrangement, it is possible to mount and dismount a target assembly located within the vacuum chamber to, or from, the support axle, without having to break or re-form a seal between the interior and exterior of the vacuum chamber.

The target assembly suitably comprises a target, such as a consumable target and/or a tubular target of a magnetron sputtering device. The target assembly is suitably detachably affixable to the hollow support axle.

The hollow support shaft suitably provides a hollow interior volume at least partially located within the vacuum chamber, but which communicates with the exterior thereof, which provides a space for accommodating electrical and/or magnetic and/or cooling elements of the device. In the case of a magnetron sputtering apparatus, the rotatable element comprises a consumable target, which is detachably affixable to the hollow support shaft, which contains a magnetic array, and optionally electrical contacts to the target and optionally a cooling circuit. The magnetic array, where provided, may comprise one or more permanent magnets and/or electromagnets.

The hollow support axle is suitably at least partially manufactured of an electrically conductive material to enable an electrical voltage to be applied to, and/or to enable an electrical current to be passed through, the target assembly. In one possible embodiment, the hollow support axle is chiefly manufactured from a dielectric material, and further comprises one or more electrical contact portions arranged to form an electrical contact, or electrical contacts, with the target assembly.

The target assembly suitably comprises a substantially cylindrical and/or tubular target and, optionally, a backing tube, which is able to rotate by appropriate in-vacuum driving means and which is mounted in a static support carrier tube construction. In the present invention only the target and backing tube, or target, assembly rotates via an appropriate engagement to a drive mechanism.

In the present invention the target and backing tube, or target, assembly does not have any dynamic rotating seals as it is in its entirety in the vacuum atmosphere region. As such, the invention provides that target and backing tube, or target, assembly does not require a static seal, as the seal between the interior and the exterior of the vacuum chamber is formed by the seal associated with the transmission (or drive assembly): the target and backing tube, or target, assembly being mounted to the transmission within the vacuum chamber.

The drive mechanism could have a vacuum feed through driving mechanism such as that provided by a ferro-fluidic seal. Additionally or alternatively, the target and backing tube, or target, assembly could be entirely driven by an in-vacuum motor with no need for a dynamic seal in the entirety of the construction.

Sealing pertaining to the end block assembly is static except in the case of the drive mechanism input where it could be dynamic or non-existent. In the present invention the electrical and thermal contact between the rotating target assembly and the static carrier tube is provided by suitable contactors and or contact media.

The low friction required for the rotation of the target and backing tube, or target, assembly with respect to the static carrier tube may be provided by suitable load bearing elements and/or a low friction media. Alternatively, there may be nothing interposed between the carrier tube and the target assembly, in certain situations, such as when the device is run without any thermal contact between the target and support axle: there being just a small gap therebetween. Electrical contact will, in the majority of situations, be needed, but this could be made at one end of the target assembly only.

The present invention aims to provide an improvement or alternative, and/or to improve the operation and/or performance of a plasma process involving a rotating target where the plasma process could be induced by different principles such as sputtering, arc, magnetron sputtering, etc. The present invention overcomes some of the limitations on the current use of dynamic seals in this area of technology, especially in respect of magnetron sputtering using cylindrical rotating targets. The present invention may enable a low leak rate during operation, which could, in turn, benefit the coating or plasma treatment quality. Furthermore, the present invention offers the possibility of target change without breaking either one or more dynamic or static seals The present invention could also be implemented as a complete device for use in vacuum coating and or treatment technology where, for example, plasma discharge, or any other appropriate source of energy form such as arcs, laser, which can be applied to the target or in its vicinity would produce suitable coating deposition or suitable plasma treatment on components of different nature.

In particular, although not exclusively, the present invention also relates to the use of this device in conjunction with a suitable magnetic field provided by a magnetic array so that the unit could be used as a magnetron sputter source as the magnetic field over the target surface together with the biasing of the target providing a magnetron effect and, under adequate conditions of rarefied vacuum atmosphere, a plasma discharge can be established to carry out processes such as sputtering deposition, plasma etching, plasma treatment, plasma polymerisation, CVD etc.

An aspect of the invention may be characterised by during mounting and/or changing of the target assembly, no seal is broken, providing the benefit of reliable vacuum integrity during these operations.

Suitably, an end block may be provided which provides a water coolant and electric power interface with no rotating contacts.

In one of the embodiments of the present invention, the electric power transmission from the mounting tube to the target or target assembly is provided via suitable annular flexible contacts, which annular flexible contacts may provide the main path for heat and/or electrical transmission to and from the target assembly.

In one of the embodiments of the present invention the electrical power transmission from the mounting tube to the target assembly is provided via suitable flexible contacts which could be distributed randomly or in any arrangement that would produce appropriate electrical power transmission.

In one of the embodiments of the present invention the thermal transfer of the target to assembly to the mounting tube is provided via suitable media. This media could be in nature the same of different from the elements providing the electrical transmission. The media could have elements than enhance thermal cooling such as silicone fluid or paste, a silver paste, a ZnO paste or any paste or fluid compound that would enable effective heat transfer from the target assembly to the cooled mounting tube.

This invention also relates to the use of such devices and control during non-reactive and reactive processes, with or without feedback plasma process control.

The present invention also relates to the speed of rotation of the cylindrical target, from zero (static) to any rotational speed whether it is constant, complex or variable.

The present invention also relates to the use of these devices in different operation modes such as DC, DC pulsed, AC, HIPIMS (High Power Impulse Magnetron Sputtering), MPPS (Modulated Pulsed Power Sputtering), RF and any combination of power delivery.

The present invention, by improving the vacuum quality, could also improve the coating product operation and/or the final coating quality.

The present invention could be used in plasma processes such as arc, sputtering, CVD, magnetron sputtering, plasma polymerisation, plasma etching with or without magnetic array.

Other aspects of the invention relate to one or more of the group comprising: a single device or any arrangement of any number of these devices; single sources used with a passive or active anode; dual magnetron sputtering; reactive or non-reactive sputtering; and arc or magnetron sputtering processes.

A substrate associated with any one or more of the aforementioned processes may, or may not, be biased, and any one or more of the aforementioned processes could be used in web, glass, display, decorative and/or batch coaters.

Feedback control is suitably provided, such as feedback control relating to any one or more of the group comprising: rotation speed control; plasma emission monitoring control; target impedance control; partial pressure of reactive and non-reactive species control; power control; and power mode control.

The present invention also relates to any target construction suitable to be constructed, assembled on to and driven in the device of this invention.

BRIEF DESCRIPTION OF DRAWINGS

The invention shall now be described, by way of example only, with reference to the accompanying drawings in which:

FIG. 10 is a schematic side view showing a first method of mounting a tubular target at both ends;

FIG. 11 is a schematic perspective view showing a second, cantilevered method of mounting a tubular target;

FIG. 12 is a perspective view of a first possible type of drive assembly for a rotatable target assembly;

FIG. 13 is a perspective view of a second possible type of drive assembly for a rotatable target assembly;

FIG. 14 is a perspective view of a third possible type of drive assembly for a rotatable target assembly;

FIG. 15 is a schematic side view showing a mounting assembly similar to that shown in FIG. 10.

MODE(S) FOR CARRYING OUT THE INVENTION

Figure 1:
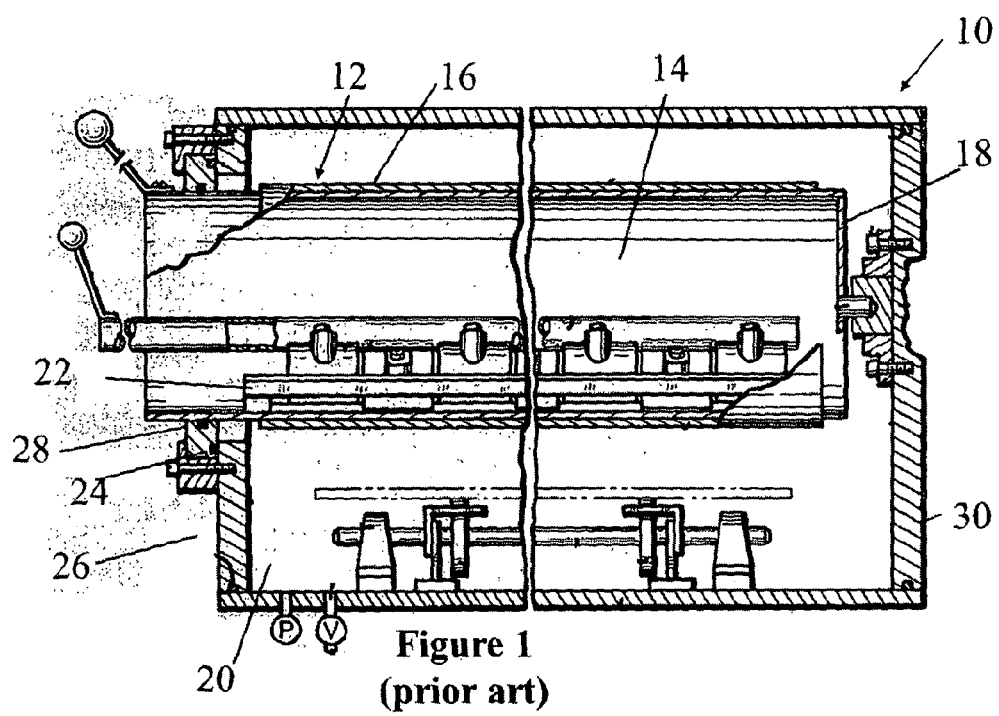
FIG. 1 is a cross-section of a prior art magnetron sputtering device.

In FIG. 1, a known cylindrical rotating magnetron sputtering device 10, as described in U.S. Pat. No. 4,356,073, comprises a tubular target assembly 12 mounted for rotation about its longitudinal axis within a vacuum chamber 14. The tubular target assembly 12 is constructed of a number of parts, in the illustrated example, a consumable tube 16, which is the target material to be sputtered off during the sputtering process; and a backing tube 18, which supports the consumable target tube 16 and which needs to have good structural properties as it separates the vacuum environment 14 from the water coolant interior 20. Located within the tubular target assembly 12 is a magnetic array 22, which is necessary for modifying the plasma distribution in a magnetron sputtering operation.

The system shown in FIG. 1 has seals 24, which sealingly separate the vacuum 14 from the atmosphere side 26. The backing tube 18 also seals on a dynamic seal 28, which allows it to rotate relative to the side wall 30 of the magnetron 10. In the arrangement of FIG. 1, the operation of changing the target assembly 12, for example, when the target 16 it has been consumed, involves opening the static seals 24 and the dynamic seals 28 because the target assembly 12 protrudes through the side wall 30 of the device 10.

Figure 2:
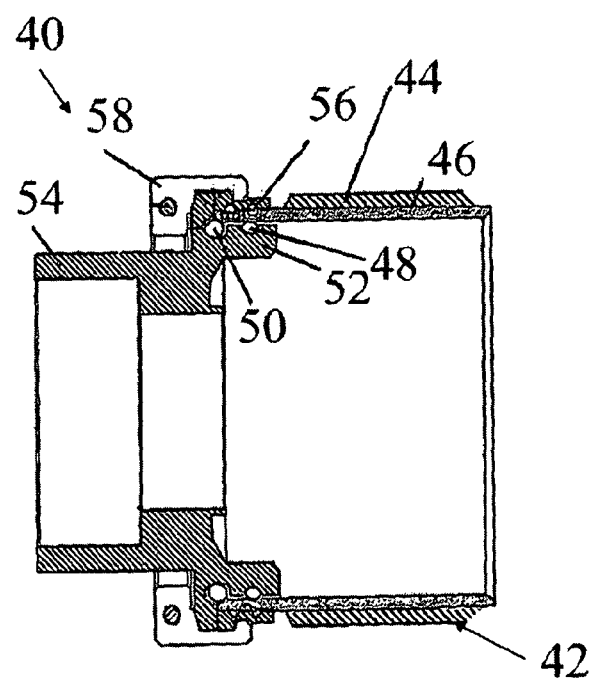
FIG. 2 is a cross-section of a prior art target assembly where the target is bonded to backing tube.
Figure 3:
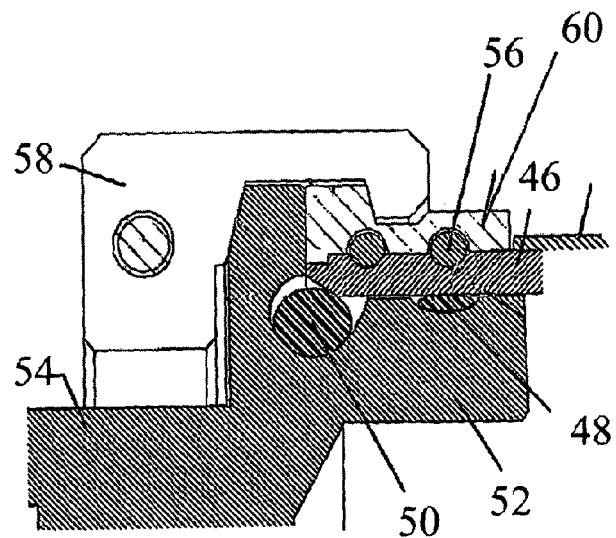
FIG. 3 is a close up of part of FIG. 2.
Figure 4:
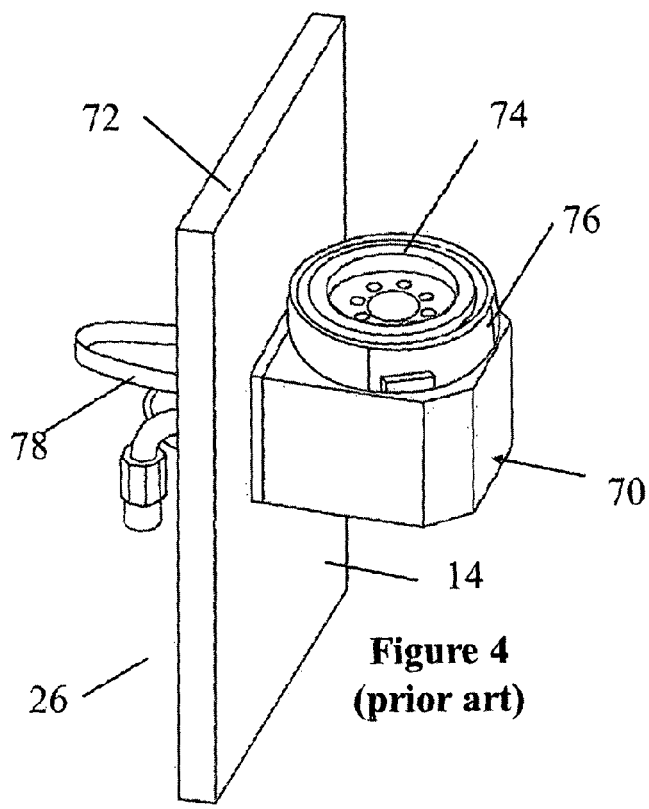
FIG. 4 is perspective view of another known end block for separating the atmosphere side from the vacuum side in a magnetron sputtering apparatus.

In FIGS. 2 and 3, which show the known type of magnetron target arrangement described in US2007/0007129, the magnetron sputtering device 40 has a target assembly 42 in which the target 44 is bonded to the backing tube 46. The backing tube 46 is directly cooled and appropriate static seals 48, 50 are used in a mounting tube zone 52 of the rotating mounting sleeve 54, guaranteeing water to vacuum sealing. Target assembly 42 is clamped using split rings 56 and clamping components 58 and 60. Due to the attachment for the target assembly 42 to the rotating mounting sleeve 54 the whole assembly rotates, and thus in this system, the mounting sleeve 54 requires a rotating dynamic seal to separate the water cooling circuit from the vacuum 14.

FIG. 3 is a perspective view of a known end block 70, as described in US2008/0202925, for use in a magnetron sputtering device. The end block 70 is mounted on a flange 72 that separates the atmosphere side 26 from the vacuum side 14. The rotating mounting tube zone 74 is the area for the target assembly is attached via clamping components 76. A driving belt 78 on the atmosphere side 26 drives the rotation of a sleeve (not visible) inside the mounting block 70 linked to the mounting tube zone 74.

Figure 5:
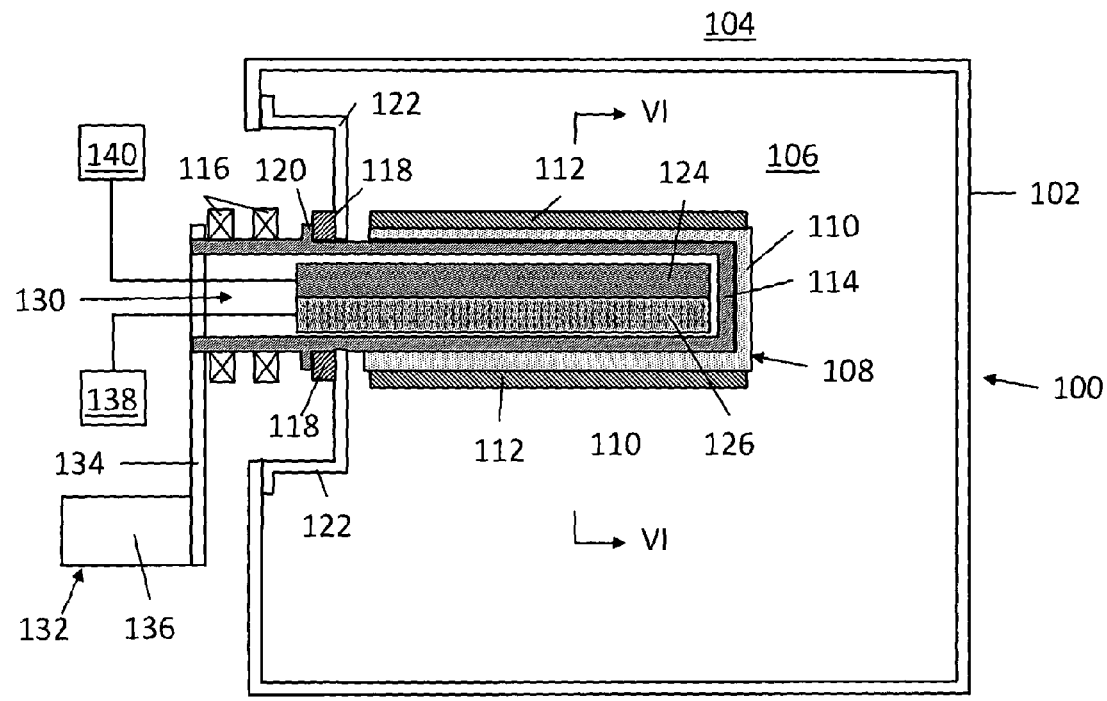
FIG. 5 is a schematic cross-section of a first embodiment of the invention with a rotating support axle.
Figure 6:
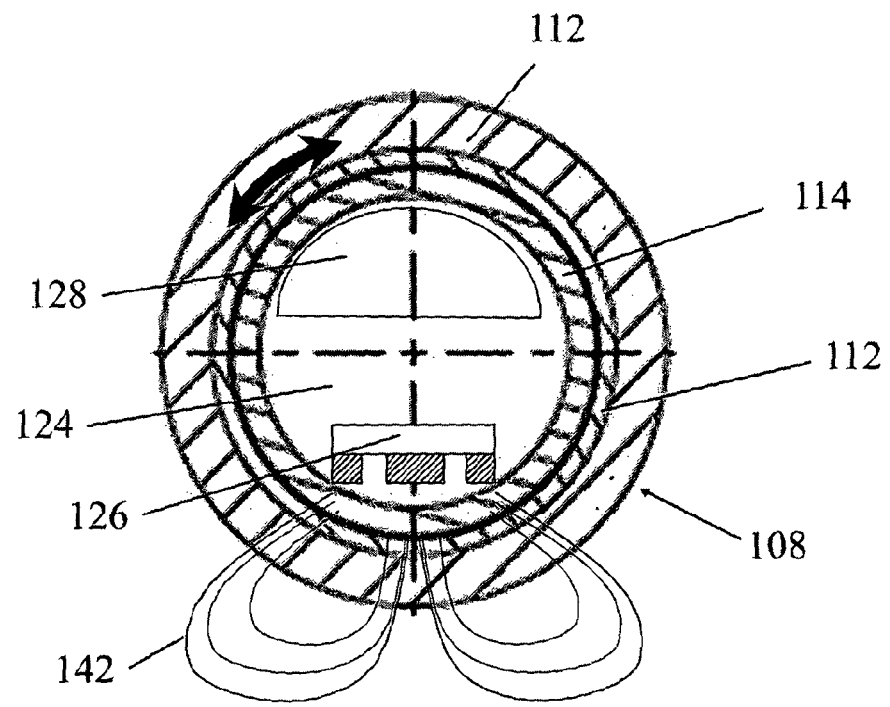
FIG. 6 is a cross-section of FIG. 5 on VI-VI.

In FIGS. 5 and 6, a schematic diagram shows how an embodiment of the invention differs from the prior art. The magnetron 100 comprises a vacuum chamber 102 separating the atmosphere 104 from a partially evacuated process chamber 106. Located within the chamber 106 is a rotatable, tubular target assembly 108, comprising an open-ended, hollow cylindrical support 110 and a consumable, tubular target 112. Target 112 is suitably attached to the backing tube 110, for example, by metal bonding. The target assembly 108 is slidingly receivable over an end of a hollow support axle 114. The hollow support axle 114 is sturdily mounted for rotation about its longitudinal axis by a set of bearings 116, located on the atmosphere side 104 of the vacuum chamber 102, and an annular dynamic seal 118 is used to provide a vacuum-tight seal between a flange 120 of the hollow support axle 114 and a side wall 122 of the vacuum chamber 102. Thus, the hollow support axle 114 is able to rotate within the vacuum chamber 102 with a target assembly 108n affixed to its interior, whilst providing a hollow interior volume 124 located within the vacuum chamber 106, which is at atmospheric pressure 104.

The hollow interior volume 124 of the support axle 114 can thus be used to house a magnet array 126 and a cooling system 128, which are accessible from without the vacuum chamber 102, via the open end 130 of the support axle 114. The drive mechanism 132, which, in the illustrated embodiment, comprises a pulley drive 134 and motor 136 assembly, is located on the atmospheric side 104 of the vacuum chamber, as are the drivers and controls 138, 140 for the magnetic array 126 and the cooling system 128, respectively.

With an arrangement according to the invention, as shown in FIG. 5, the target assembly 108 can be changed by sliding it off the support axle 114, without having to disrupt any of the dynamic seals 118, or the static seals associated with the cooling system 128. The tubular construction comprises of a static cooled zone which provides cooling, vacuum separation from the coolant zone to the vacuum and electrical and heat transfer via elements on to the support tube. The attachment of target to backing tube is such that it provides both electrical conductivity and heat transfer.

FIG. 6 shows a cross section of FIG. 5 on VI-VI where in addition appropriate magnetic field lines 142 are created by means of a magnetic assembly 126. The magnetic field lines 142 are such that the when in a rarefied vacuum atmosphere and under an induced electric field, a plasma can be ignited and a magnetron effect created, which for example, but not exclusively, could sputter off the material of target 112, if conditions are appropriate.

Figure 5A:
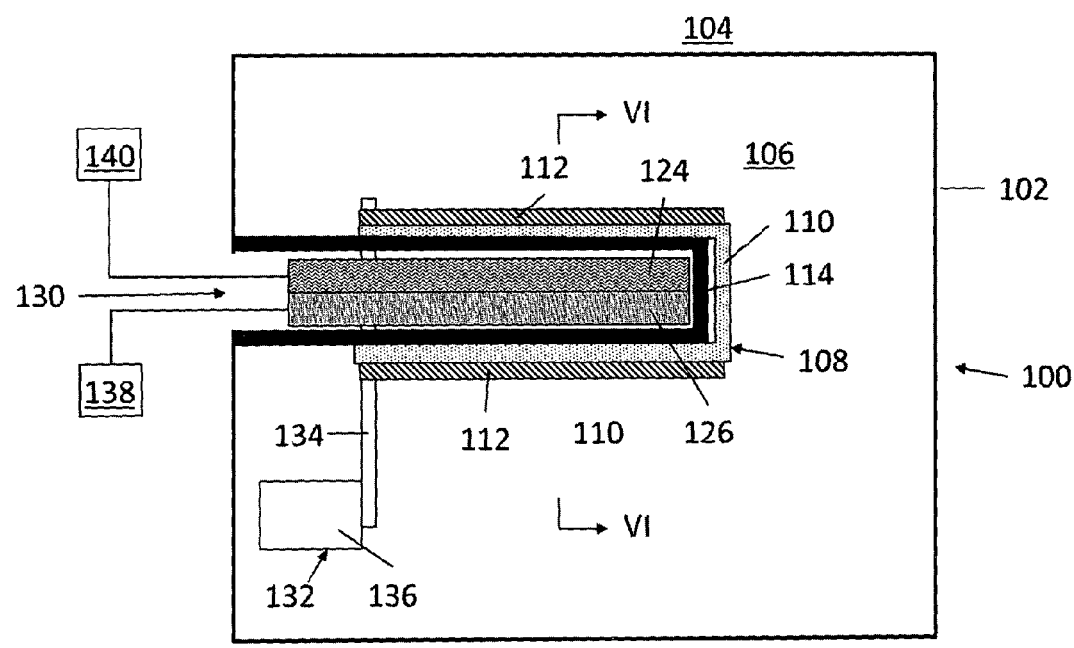
FIG. 5a is a schematic cross-section of a second embodiment of the invention with a static support axle.

The embodiment of the invention shown in FIG. 5a is largely the same as that shown in FIG. 5, except that the hollow support axle 114 is static, i.e. fixed to an interior side wall of the vacuum chamber 102 providing an open access shaft 130 into which a magnetic array 126 and a cooling/electrical system 124 is slidingly receivable. The target assembly 108 is driven for rotation about the support axle 114 by a drive assembly 132 located wholly within the vacuum chamber 106, thus avoiding the need for any dynamic seals, whilst also offering the convenience of external access to the magnet array 126 and cooling/electrical components 124, via the open end 130 of the shaft 114, and the ability to change the target assembly 108 without interfering with the magnet array 126 and cooling/electrical components 124, or without having to disrupt any seals.

Figure 7:
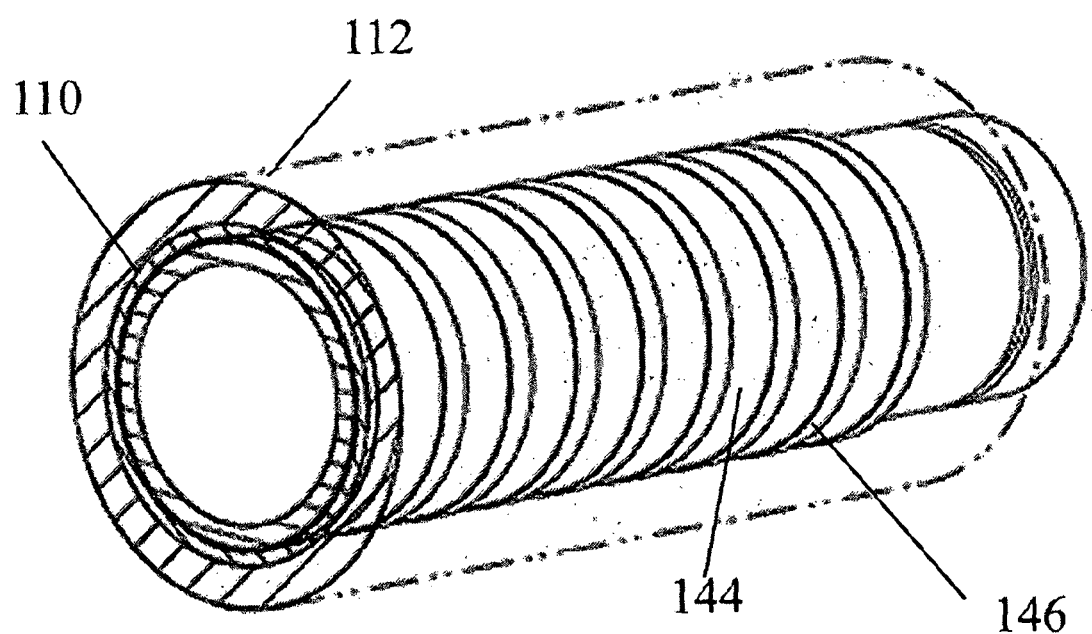
FIG. 7 is a perspective view of a type of hollow support axle, such as that shown in FIGS. 5 and 6.

FIG. 7 is a schematic view of an embodiment of the present invention. Target assembly 108 is attached to the rotating support axle 114, whilst electric, and heat, transfer is provided from and to and from the assembly via suitable annular elements 144.

As previously described, the target assembly 108 is driven by engaging to an in-vacuum rotating element 114. The weight/load of the target assembly 108 is transferred to the support axle 114 by bearing components 146, while the electrical and thermal contacts are provided by suitable elements or media elements 144.

In an alternative embodiment of the invention, the support axle 114 previously described does not rotate, but is static, and merely provides a hollow interior volume for housing the magnetic array 126 and the cooling elements 128. The support axle 114 can be electrically biased by applying voltages and/or currents to various parts thereof, such as the annular contact regions 144, shown in FIG. 7. To avoid uneven erosion of the target 112, in use, the target and its support 110 can be driven to rotate relative to the static support axle 114 by a suitable in-vacuum drive mechanism.

The use of a static support axle 114 offers a number of advantages in terms of simplification as it avoids the need for any dynamic seals to be associated with the cooling, electrical or magnetic systems: the only moving part being the target assembly 108, which rotates relative thereto. Of course, the target assembly 108 could be rotated by an external drive mechanism, in which case dynamic seals would be needed where a driven portion thereof extends through the side wall 102 of the vacuum chamber 106. However, if the target assembly 108 is motor-driven, the motor and transmission could be located within the vacuum chamber, in which case, no dynamic seals could be needed at all.

Figure 8:
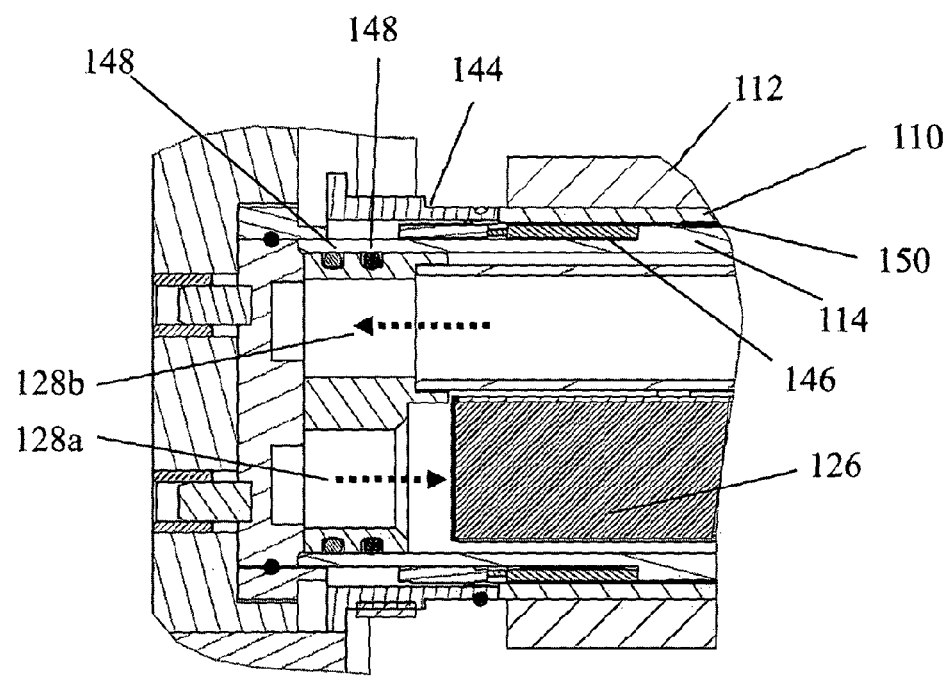
FIG. 8 is a schematic partial cross-section through a second embodiment of the invention.

Such an arrangement is shown in FIG. 8, whereby it will be seen that the support axle 114 is static, and only requires static seals 148 to preserve the separation between the vacuum 106 and atmospheric sides 104 of the system. A coolant system 128 comprises inlet 128a and outlet pipes 128b, and a magnetic array 126 is also housed within the static support axle 114. The target assembly 110, 112, is driven for rotation about the support axle 114 and electrical connections are made between the support axle 114 and the backing tube 110 via annular contact rings 144, 146. A thin-film medium 150 is interposed between the target assembly 108 and the support axle 114 to provide electrical connection and thermal transfer between the target assembly 108 and the static mounting axle 114. The media 150 comprises, in this case, elements that provide conductivity and a lubrication, such as silicone base paste with conductive additives e.g. silver and/or or zinc oxide. The lubricating media 150 offers lubrication without excessive limitation on the thermal and electrical transport. Annular rings 146, 148, in certain embodiments, can provide containment of the lubricating media 150 and also allow thermal expansion of the target assembly 108.

Figure 9:
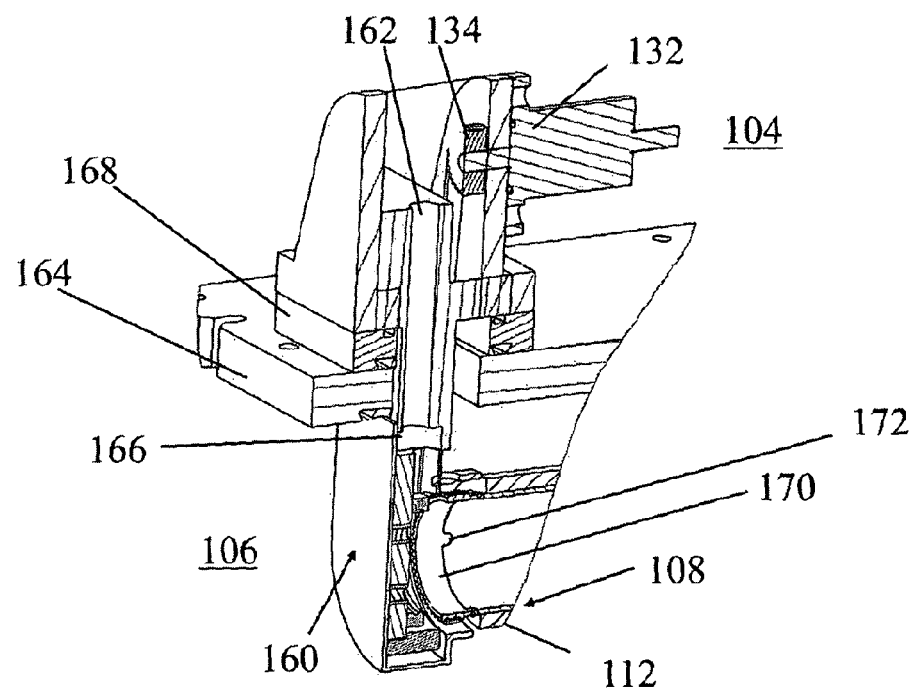
FIG. 9 is a partial section through an end block for supporting a tubular target as described herein.

FIG. 9 shows a partial section of the driving side end block 160 comprising components that are on the vacuum side 106 whilst other components are on the atmospheric side 104. Electrical power is transmitted through appropriate access 162 and electrical isolation between end block elements and flange 164 separating the vacuum 106 and atmospheric sides 104, are provided via insulators 166, 168. A suitable in-atmosphere driver elements 132, such as a motor, transmits rotary movement into the vacuum chamber 106 via in-vacuum element 134. Engaging element 170 transmits rotary movement to the target assembly 108 by appropriate locking components 172 between element 170 and backing tube 110 of the target assembly.

FIG. 10 shows a first mounting option for a rotatable target 108 according to the invention in which the target assembly 108 is supported at both ends by end blocks 160*a* and 160*b*. Typically the end blocks 160 will attach and form part of the separation between vacuum 106 and atmosphere side 104.

In the alternative embodiment of FIG. 11, the target assembly 108 is cantilevered from a single end block 160 (as shown in FIG. 5, for example), whereby the end block 160 provides separation between the vacuum side 106 and atmospheric side 104.

FIGS. 12, 13 and 14 show three driving options for the rotary movement of the target assembly (not shown). In FIG. 12, the drive is via a worm gear 180 driving an in-vacuum worm wheel 182. In FIG. 13, a belt 134 drives a pulley wheel. In FIG. 14, bevel gears, or cross-helical gears 184, 186 (pinion and wheel, respectively) are used.

FIG. 15 shows a an example of the present invention where the target assembly 108 presents a lower profile level 190, 192 with respect to mounting end blocks 160*a* and 160*b*, respectively. This low profile allows a lower re-deposition of material from target 112 during the process, such as sputtering of target 112, in such way that a prolonged time of use without need of service before target change is needed. Suitable mounting elements and flange 32 separate vacuum side 13 from atmospheric side 12. It will be noted, in FIG. 15, that one of the end blocks 160*b* is detachably affixed to the wall 102 of the vacuum chamber using a wing-nut assembly 194, that allows the end block 160*b* to be slid axially to clear the end of the target assembly 108 so that it can be removed from the support axle.

Figure 16:
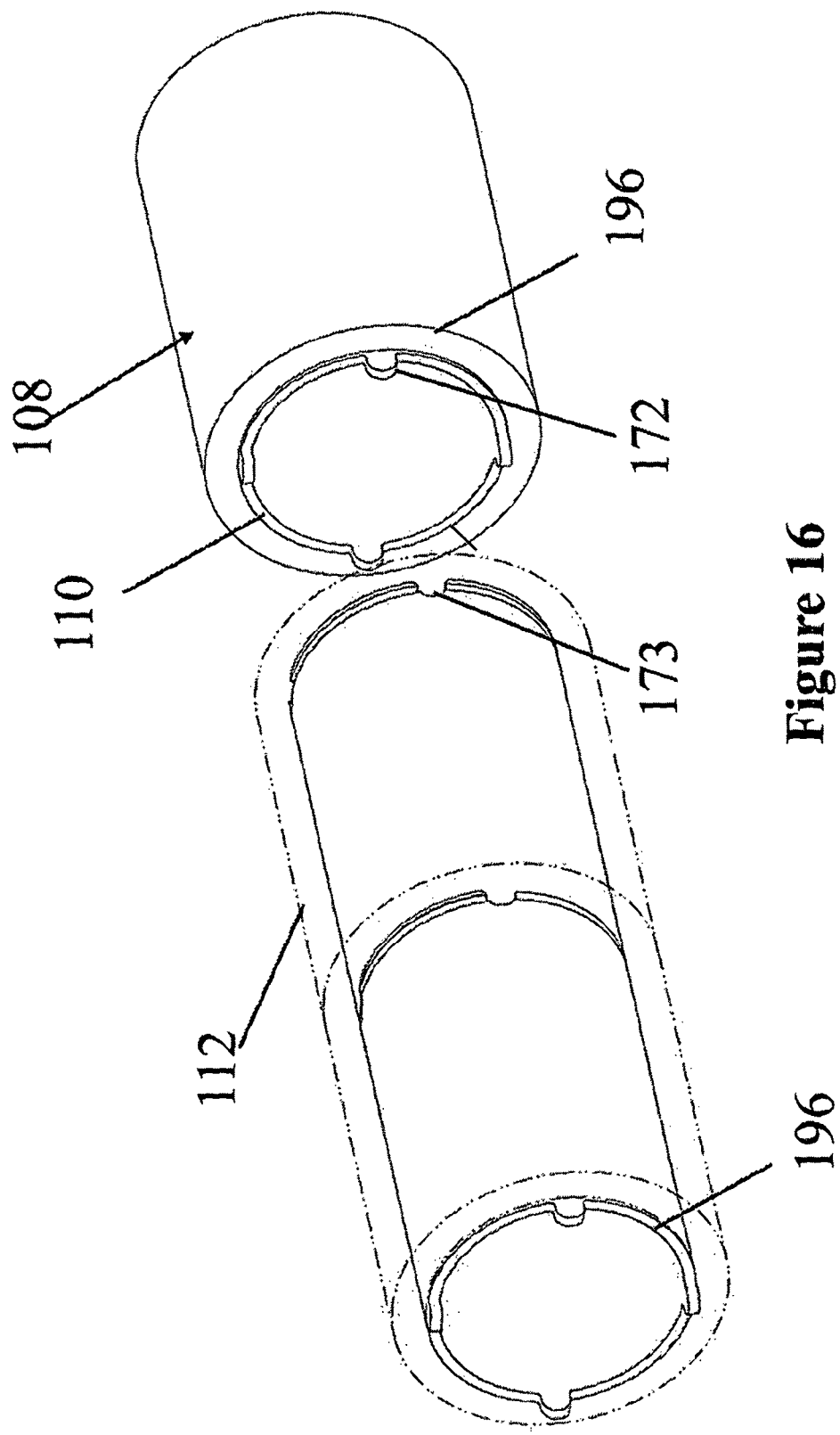
FIG. 16 is a schematic perspective view showing a modular target assembly in accordance with the invention.

Finally, FIG. 16 shows a cross a possible target construction of the present invention where different target sections 196 can be engaged one to the other so that the target assembly 108 is made of different target sections 196. Suitable engagement elements 172 and 173 provide driving engagement between target sections 196. It is preferable to have the engagement elements as part of the backing tube 110, although not exclusively.

The invention claimed is:

1. An apparatus for rotating a rotatable element located within a vacuum chamber, comprising:

a hollow support axle that remains in-situ and that extends into the vacuum chamber, the hollow support axle defining a volume within the vacuum chamber that is sealingly isolated from the vacuum chamber, and the hollow support axle comprising an open end communicating with an exterior of the vacuum chamber, wherein:

a target assembly comprising an open ended, hollow cylindrical support and a consumable tubular target is detachably affixed to the hollow support axle, the target assembly being mounted for rotation about a longitudinal axis of the hollow support axle, and a drive assembly is operatively connected to the target assembly, and configured to rotate the target assembly.

2. The apparatus of claim 1, wherein the drive assembly comprises a motor and a ratio changing means.

3. The apparatus of claim 1, wherein the drive assembly is located outside the vacuum chamber.

4. The apparatus of claim 1, further comprising:

a dynamic seal interposed to form a seal between a wall of the vacuum chamber and a component, the component being at least one of the hollow support axle and the target assembly rotating relatively to the hollow support axle.

5. The apparatus of claim 4, wherein the dynamic seal comprises a ferro-fluidic seal.

6. The apparatus of claim 1, wherein the hollow support axle comprises a hollow interior volume at least partially located within the vacuum chamber, the hollow interior volume communicating with the exterior of the vacuum chamber.

7. The apparatus of claim 6, wherein the hollow support axle comprises a hollow interior volume, the hollow interior volume having located within it at least one of means for electrically biasing the target assembly;

one or more magnetic arrays;

a cooling system for the target assembly; and a cooling system for the one or more magnetic arrays located within the hollow interior volume.

8. The apparatus of claim 7, wherein the one or more magnetic arrays comprises at least one of one or more permanent magnets and one or more electromagnets.

9. The apparatus of claim 7, wherein the hollow support axle is manufactured of a substantially dielectric material, and the hollow support axle further comprises one or more electrical contact portions arranged to form at least one electrical contact with the target assembly.

10. The apparatus of claim 7, wherein the means for electrically biasing the target assembly is adapted to apply to the target at least one of a DC voltage;

a pulsed DC voltage;

an AC voltage;

a High Power Impulse Magnetron Sputtering voltage;

a Modulated Pulsed Power Sputtering voltage; and a Radio Frequency voltage.

11. The apparatus of claim 2, wherein the target assembly is biased with respect to a substrate located within the vacuum chamber.

12. The apparatus of claim 1, wherein the hollow support axle extends through a wall of the vacuum chamber separating an evacuated volume of the hollow support axle from the atmosphere, and the hollow support axle further comprises one or more dynamic seals to form a vacuum-tight seal between the hollow support axle and the wall of the vacuum chamber.

13. The apparatus of claim 2, wherein the hollow support axle is held static, and the target assembly is mounted for rotation about the hollow support axle.

14. The apparatus of claim 13, further comprising:
a medium interposed between an exterior of the hollow support axle and an interior of the target assembly, the medium providing at least one of
    a low-friction interface between the target assembly and the hollow support axle;
    a high-friction interface between the target assembly and the hollow support axle;
    a bond between the target assembly and the hollow support axle;
    an electrical contact between the target assembly and the hollow support axle; and
    a heat transfer interface between the target assembly and the hollow support axle.

15. The apparatus of claim 14, wherein the drive assembly is adapted to rotate the target assembly in either direction, at a constant speed, at a variable speed or in a complex manner.

16. The apparatus of claim 15, wherein the target assembly is modular, and further comprises a plurality of target assembly portions affixed to one another end-to-end.

17. The apparatus of claim 16, wherein each of the target assembly portions comprises means for inhibiting relative rotation of the target assembly portions.

18. The apparatus of claim 17, further comprising:
a feedback control means associated with at least one of
    a cooling system;
    an electrical biasing system;
    the drive assembly;
    a magnetic array;
    a rotation speed control;
    a plasma emission monitoring control;
    a target impedance control;
    a partial pressure of reactive and non-reactive species control;
    a power control; and
    a power mode control.

19. The apparatus of claim 18, further comprising a vacuum pump for evacuating the vacuum chamber.

20. The apparatus of claim 19, further comprising a gas control apparatus for introducing desired quantities of process gasses into the vacuum chamber.

* * * * *